United States Patent
Cardalda-Garcia et al.

(10) Patent No.: US 11,187,749 B2
(45) Date of Patent: Nov. 30, 2021

(54) TEST EQUIPMENT FOR OVER THE AIR TESTS AS WELL AS METHOD FOR TESTING A DEVICE UNDER TEST

(71) Applicant: Rohde & Schwarz GmbH & Co. KG, Munich (DE)

(72) Inventors: Adrian Cardalda-Garcia, Munich (DE); Bledar Karajani, Munich (DE); Niels Petrovic, Munich (DE); Edwin Menzel, Munich (DE); Heinz Mellein, Munich (DE); Johannes Koebele, Munich (DE); Jochen Oster, Munich (DE); Vincent Abadie, Munich (DE); Jens Wappler, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 50 days.

(21) Appl. No.: 16/453,213

(22) Filed: Jun. 26, 2019

(65) Prior Publication Data
US 2020/0003834 A1    Jan. 2, 2020

(30) Foreign Application Priority Data

Jun. 29, 2018 (EP) .................................... 18180848

(51) Int. Cl.
*G01R 31/319* (2006.01)
*H04B 17/00* (2015.01)

(52) U.S. Cl.
CPC . *G01R 31/31905* (2013.01); *G01R 31/31908* (2013.01); *G01R 31/31926* (2013.01); *H04B 17/0085* (2013.01)

(58) Field of Classification Search
CPC ........ G01R 31/31905; G01R 31/31908; G01R 31/31926; G01R 31/002; G01R 29/0814; H04B 17/0085; H04B 17/00; H04K 3/68
USPC ......................................................... 714/742
See application file for complete search history.

(56) References Cited

U.S. PATENT DOCUMENTS

| | | | | |
|---|---|---|---|---|
| 5,327,091 A * | 7/1994 | Loughry | .............. | G01R 29/105 324/603 |
| 7,105,787 B2 * | 9/2006 | Clemen, Jr. | .............. | H05B 6/72 219/702 |
| 2008/0056340 A1 | 3/2008 | Foegelle | | |
| 2011/0285405 A1 * | 11/2011 | Hirata | ................ | G01R 29/0878 324/637 |
| 2015/0054687 A1 | 2/2015 | Reed | | |

FOREIGN PATENT DOCUMENTS

EP          3273257 A1    1/2018
WO      2010/040889 A1    4/2010

* cited by examiner

Primary Examiner — James C Kerveros
(74) Attorney, Agent, or Firm — Christensen O'Connor Johnson Kindness PLLC

(57) ABSTRACT

A test equipment is provided for over the air tests on a device under test, in particular a user equipment, having a shielded space, at least one signal antenna for transmitting and receiving cellular signals arranged in the shielded space, and a plurality of noise antennas arranged in the shielded space linked in an array configured to create Additive White Gaussian Noise. The noise antennas are equally distributed in three dimensions within the shielded space. Further, a method for testing a device under test is shown.

20 Claims, 2 Drawing Sheets

TEST EQUIPMENT FOR OVER THE AIR TESTS AS WELL AS METHOD FOR TESTING A DEVICE UNDER TEST

FIELD OF THE DISCLOSURE

The disclosure relates to a test equipment for over the air (OTA) tests on a device under test, in particular a user equipment, as well as a method for testing a device under test, in particular a user equipment.

BACKGROUND

OTA tests on devices under test are well-known, wherein it is known to create Additive White Gaussian Noise (AWGN) as a noise background for the measurements. For exact measurements, it is desirable to have a homogeneous, in particular a spatially white Additive White Gaussian Noise at the location of the device under test. However, it is believed that an infinite number of antennas creating the Additive White Gaussian Noise would be needed to create homogeneous or spatially white Additive White Gaussian Noise.

SUMMARY

Thus, it is an object of the disclosure to provide a test equipment and a method for testing a device under test being able to create homogeneous and especially spatially white Additive White Gaussian Noise at the location of the device under test.

For this purpose or others, a test equipment for over the air tests on a device under test, in particular a user equipment, is provided. According to an embodiment, the test equipment comprises a shielded space, at least one signal antenna for transmitting and receiving cellular signals arranged in the shielded space, and a plurality of noise antennas arranged in the shielded space linked in an array configured to create Additive White Gaussian Noise. The noise antennas in some embodiments are equally distributed in three dimensions within the shielded space.

The disclosure is based on, among other thing, the finding that homogeneous and especially spatially white Additive White Gaussian Noise may be created by an array of noise antennas, wherein the noise antennas within the array are equally distributed at three dimensions. Thus, homogeneous Additive White Gaussian Noise may be created with only a finite number of noise antennas. The cellular signals are for example 5G/LTE signals or the like.

In an embodiment, the test equipment may comprise an array control unit configured to control the noise antennas to create the additive white Gaussian noise using at least two of the noise antennas. In some embodiments, the array control unit can be implemented in hardware or software or a combination of hardware and software.

Within this disclosure equally distributed in three dimension means that the noise antennas are arranged along three perpendicular axis and each noise antenna having a predefined distance to the nearest neighbors.

In some embodiments, the noise antennas are arranged and/or the array is configured such that the created Additive White Gaussian Noise is spatially white, at least at the location of the device under test. This way, high quality measurements may be performed.

To improve the quality of the test, the shielded space may be, for example, an anechoic chamber or an anechoic room.

In an embodiment, the signal antenna is a downlink antenna and/or a measurement antenna for precise measurements.

In some embodiments of the disclosure, the test equipment comprises a support for the device under test within the shielded space, wherein the support is moveable within the shielded space or spaced equidistantly from the plurality of noise antennas and/or corners of the shielded space. This way, very versatile or very precise measurements are possible. In one embodiment, the support may be located in center of the shielded space.

In some embodiments of the disclosure, the plurality of noise antennas are arranged in a regular lattice allowing a very precise creation of the Additive White Gaussian Noise. The lattice may be, for example, a Bravais lattice, especially a cubic lattice.

To achieve even higher measurement quality, the shielded space has, for example, a substantially cuboid, in particular cubic shape.

In one embodiment of the disclosure, the noise antennas are located in the corners of the shielded space to minimize near field disturbances. For example, eight noise antennas are provided, wherein one noise antenna is provided in each of the corners of the shielded space, yielding a very effective test equipment. The test equipment in some embodiments may comprise exactly eight noise antennas.

In another embodiment, six noise antennas are provided, wherein one noise antenna is provided on each of the sidewalls of the shielded space, for example in the center of each sidewall. This way, the test equipment can be realized with very few noise antennas. In an embodiment, the test equipment comprises exactly six noise antennas.

In order to further reduce the number of antennas, at least one of the noise antennas is configured to transmit and receive cellular signals, for example the at least one of the noise antennas is the signal antenna.

In another embodiment, the signal antenna is an antenna separate from the plurality of noise antennas providing a high measurement quality.

The signal antenna is, for example, connected to a signal control unit configured to generate and receive cellular signals. In some embodiments, the signal control unit can be implemented in hardware or software or a combination of hardware and software.

Further, a method for testing a device under test, in particular a user equipment, is provided for this purpose, for example using the test equipment according to the disclosure. The method in some embodiments comprises the following steps:

placing the device under test in a shielded space, creating a cellular signal in the shielded space using a signal antenna, creating Additive White Gaussian Noise in the shielded space using a three dimensional array of noise antennas, and measuring signals emitted by the device under test using the signal antenna.

In some embodiments, the Additive White Gaussian Noise is created to be spatially white Additive White Gaussian Noise. This way, high quality measurements may be performed.

In an embodiment, at least two noise antennas of the array of noise antennas are used to create the Additive White Gaussian Noise, leading to a very homogeneous noise background.

The device under test may also be, for example, a base station, employed, for example, in cellular communications.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
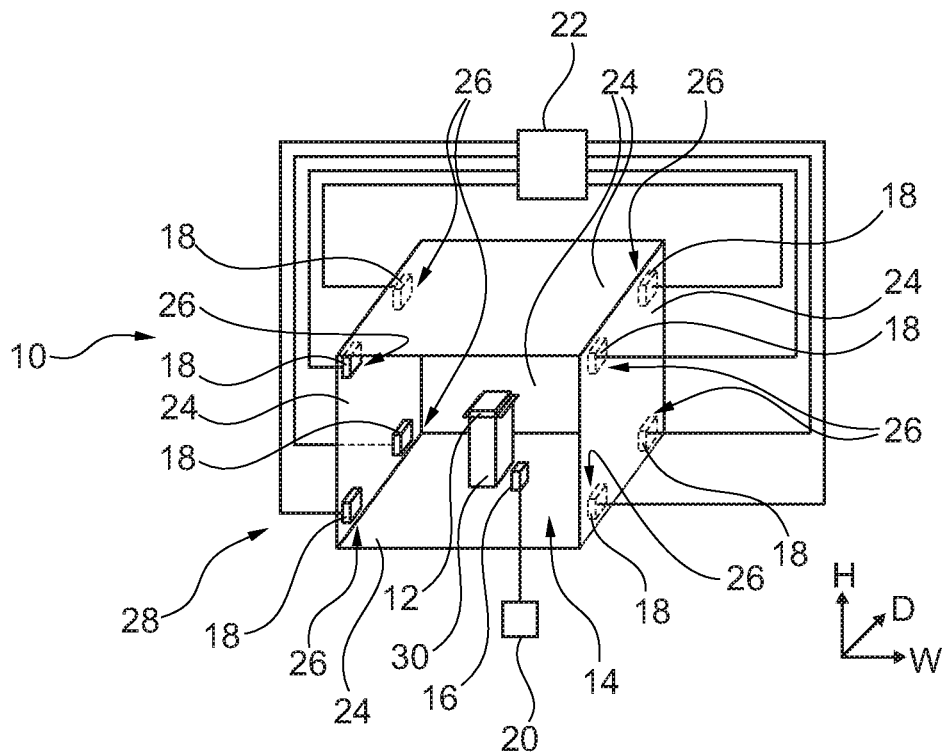
FIG. 1 shows schematically a first embodiment of a test equipment according to the disclosure in a perspective view.

FIG. 1 shows a test equipment 10 for over the air (OTA) tests of a device under test 12. In the shown embodiment, the device under test 12 is a user equipment, like a mobile phone, laptop, tablet or any other mobile telecommunications device.

As shown in FIG. 1, the test equipment 10 comprises a shielded space 14, a signal antenna 16, a plurality of noise antennas 18, a signal control unit 20 and an array control unit 22.

In the shown embodiment, the shielded space 14 is an anechoic room shielded from external electromagnetic radiation. The shielded space 14 has a cuboid shape, in particular the shielded space 14 is cubic. Thus, the shielded space 14 comprises six sidewalls 24 defining eight corners 26.

The signal antenna 16 in some embodiments is a downlink and measurement antenna. The signal antenna 16 may be located at anyone of the sidewalls 24 and is separate from the noise antennas 18 in the shown embodiment. The signal antenna 16 is electrically connected to the signal control unit 20, which is configured to control and drive the signal antenna 16 to emit and receive cellular signals, like 5G/LTE-, GSM-signals or the like.

In the shown embodiment, eight signal antennas 16 are provided, wherein one noise antenna 18 is located in each of the eight corners 26. The noise antennas 18 are therefore spaced along a width dimension W, a height dimension H and a depth direction D of the shielded space 14, i.e. the noise antennas 18 are distributed in three dimensions. Needless to say, the width direction W, the height direction H and the depth direction D are perpendicular to each other.

The distance between neighboring noise antennas 18 is preferably the same, so that the noise antennas 18 are distributed equally in the three dimensions of the shielded space 14. In the shown embodiment, the noise antennas 18 are arranged, for example, in a regular lattice being, for example, a cubic Bravais lattice.

The noise antennas 18 are electrically connected to the array control unit 22 that is configured to control and drive the noise antennas 18. The noise antennas 18 therefore form an array 28.

The array control unit 22 is configured to create Additive White Gaussian Noise (AWGN), especially spatially white Additive White Gaussian Noise and the noise antennas 18 in the array 28 are arranged such that the Additive White Gaussian Noise is spatially white at least at the location of the DUT. Spatially white means in this disclosure that the Additive White Gaussian Noise is coming from every possible direction with the same power.

The test equipment 10 further comprises a support 30 that is configured to securely hold the device under test 12. The support 30 therefore defines the location of the device under test 12. In the shown embodiment, the support 30 is located in the center of the shielded space 14 so that the location of the device under test 12 and the device under test 12 itself are located in the center of the shielded space 14. The device under test 12 is therefore equidistantly spaced from each corner 26 and therefore also from each of the noise antennas 18.

For performing an over the air (OTA) test of the device under test 12, the device under test 12 is placed on the support 30 within the shielded space 14 of the test equipment 10 (step S1). The shielded space 14 may then be closed or otherwise sealed before the measurement.

For the test, the signal control unit 20 controls the signal antenna 16 to create a cellular signal for communication with the device under test (step S2). Simultaneously, the array control unit 22 drives at least two noise antennas 18 of the array 28 of noise antennas 18 to create Additive White Gaussian Noise that is spatially white at the location of the device under test 12 (step S3).

One or more functions of the device under test 12 have been activated or are activated so that the device under test 12 emits a response to the cellular signals created by the signal antenna 16.

Using the signal antenna 16, the signal control unit 20 receives and measures the signal emitted from the device under test 12 (step S4). Thus, with a finite number of noise antennas 18 a spatially white Additive White Gaussian Noise may be created for specific test cases.

Figure 2:
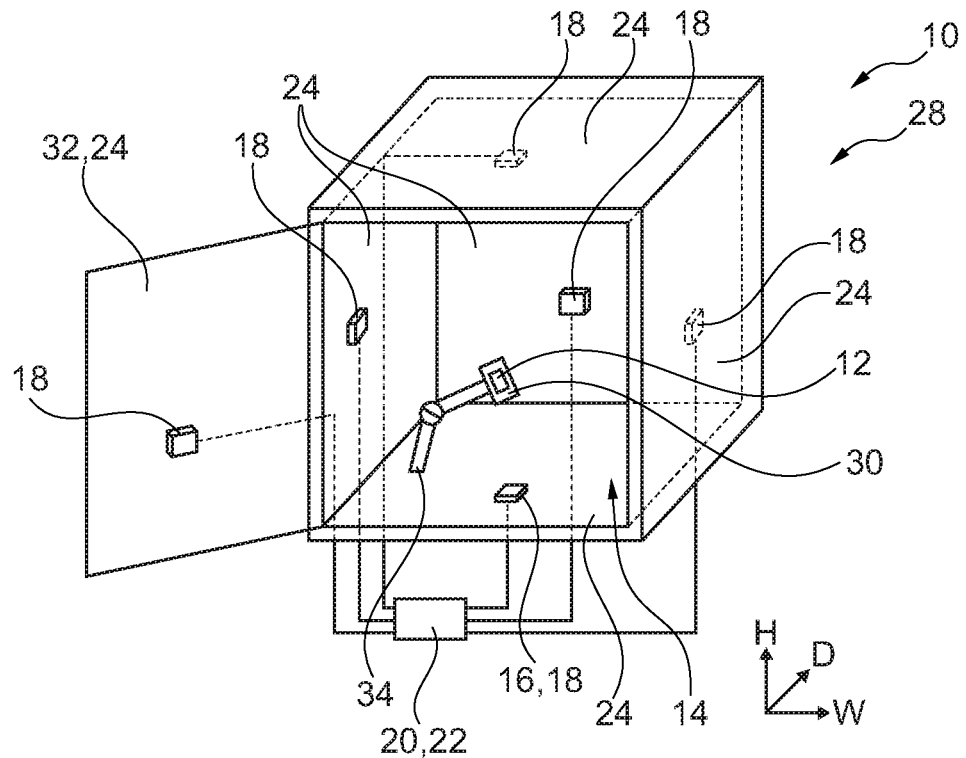
FIG. 2 shows schematically a second embodiment of the test equipment in a perspective view.
Figure 3:
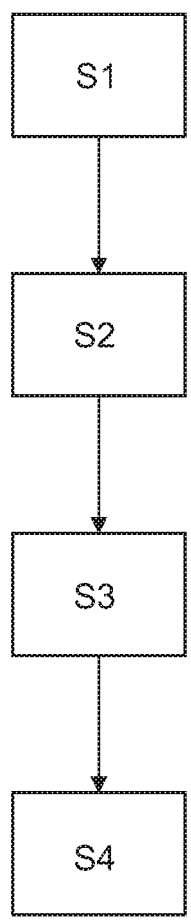
FIG. 3 shows a flow-chart of a representative method according to the disclosure.

FIG. 2 shows a second embodiment of the test equipment 10 that corresponds essentially to the test equipment 10 of the first embodiment. Thus, only the differences between the embodiments are explained in the following, wherein same reference signs are used for identical or like parts.

In the second embodiment, the shielded space 14 is an anechoic chamber. The anechoic chamber may be closed using a door 32 defining a sidewall 24.

In the second embodiment, only six noise antennas 18 are provided, wherein one of the noise antennas 18 is located at the center of each of the sidewalls 24 of the shielded space 14, including the door 32. Further, in the shown embodiment, at least one of the noise antennas 18 is configured to transmit and receive cellular signals so that this at least one noise antenna 18 is the signal antenna 16. Thus, no separate signal antenna 16 is provided in this embodiment. Hence, the signal control unit 20 and the array control unit 22 are designed as a single control unit.

In the second embodiment, the support 30 is moveable within the shielded space, for example using a moveable arm 34. The range of motion of the moveable arm 34, the array 28 and the array control unit 22 are adapted to each other so that the Additive White Gaussian Noise created by the array 28 is spatially white within the range of motion of the support 30.

The shown embodiments are examples of the disclosure, and the features of one of the embodiments can of course be applied to the other embodiment. For example, the test equipment 10 of FIG. 1 can be equipped with a moveable support 30 and/or noise antennas 18 located at the center of the sidewalls 24.

The signal control unit 20 and/or the array control unit 22 may include, in some embodiments, logic for implementing the technologies and methodologies described herein. This logic of the control units 20 and/or 22 can be carried out in either hardware or software, or a combination of hardware and software. In some embodiments, the control units 20 and/or 22 include one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the control units 20 and/or 22 include a microprocessor and a memory storing logic modules and/or instructions. In an embodiment, the control units 20 and/or 22 include one or more ASICs having a plurality of predefined logic components. In an embodiment, the control units 20 and/or 22 include one or more FPGA having a plurality of programmable logic components. In an embodiment, the control units 20 and/or 22 include hardware circuit implementations (e.g., implementations in analog circuitry, implementations in digital circuitry, and the like, and combinations thereof). In an embodiment, the control units 20 and/or 22 include combinations of circuits and computer program products having software or firmware instructions stored on one or more computer readable memories that work together to cause a device to perform one or more methodologies or technologies described herein.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test equipment for over the air tests on a device under test, comprising a shielded space, at least one signal antenna for transmitting and receiving cellular signals arranged in the shielded space, and a plurality of noise antennas arranged in the shielded space linked in an array configured to create Additive White Gaussian Noise, wherein the signal antenna is separate from the plurality of noise antennas, wherein the signal antenna is connected to a signal control unit configured to generate cellular signals, wherein the noise antennas are equally distributed in three dimensions within the shielded space such that homogeneous Additive White Gaussian Noise is created at the location of the device under test by the noise antennas.

2. The test equipment according to claim 1, wherein the noise antennas are arranged such that the created Additive White Gaussian Noise is spatially white, at least at the location of the device under test.

3. The test equipment according to claim 1, wherein the array is configured such that the created Additive White Gaussian Noise is spatially white, at least at the location of the device under test.

4. The test equipment according to claim 1, wherein the shielded space is an anechoic chamber or an anechoic room.

5. The test equipment according to claim 1, wherein the signal antenna is at least one of a downlink antenna and a measurement antenna.

6. The test equipment according to claim 1, wherein the test equipment comprises a support for the device under test within the shielded space, wherein the support is moveable within the shielded space or spaced equidistantly from at least one of the plurality of noise antennas and corners of the shielded space.

7. The test equipment according to claim 1, wherein the plurality of noise antennas are arranged in a regular lattice.

8. The test equipment according to claim 1, wherein the shielded space has a substantially cuboid shape.

9. The test equipment according to claim 8, wherein the shielded space has a cubic shape.

10. The test equipment according to claim 8, wherein the noise antennas are located in the corners of the shielded space.

11. The test equipment according to claim 10, wherein eight noise antennas are provided, wherein one noise antenna is provided in each of the corners of the shielded space.

12. The test equipment according to claim 8, wherein six noise antennas are provided, wherein one noise antenna is provided on each of the sidewalls of the shielded space.

13. The test equipment according to claim 12, wherein the noise antennas are provided in the center of the respective sidewall.

14. The test equipment according to claim 1, wherein at least one of the noise antennas is configured to transmit and receive cellular signals.

15. The test equipment according to claim 14, wherein the at least one of the noise antennas is the signal antenna.

16. The test equipment according to claim 1, wherein the signal antenna is an antenna separate from the plurality of noise antennas.

17. A method for testing a device under test, comprising:
placing the device under test in a shielded space;
creating a cellular signal in the shielded space using a signal antenna;
creating Additive White Gaussian Noise in the shielded space using a three dimensional array of noise antennas such that homogeneous Additive White Gaussian Noise is created at the location of the device under test by the noise antennas, wherein the noise antennas are separately formed with respect to the signal antenna; and measuring signals emitted by the device under test using the signal antenna.

18. The method according to claim 17, wherein the Additive White Gaussian Noise is created to be spatially white Additive White Gaussian Noise, at least at the location of the device under test.

19. The method according to claim 17, wherein at least two noise antennas of the array of noise antennas are used to create the Additive White Gaussian Noise.

20. A test equipment for over the air tests on a device under test, comprising a shielded space, at least one signal antenna for transmitting and receiving cellular signals arranged in the shielded space, and a plurality of noise antennas arranged in the shielded space linked in an array configured to create Additive White Gaussian Noise, wherein the noise antennas are equally distributed in three dimensions within the shielded space, wherein the noise antennas are equally distributed in three dimension such that the noise antennas are arranged along three perpendicular axis and that each noise antenna has a predefined distance to the nearest neighbors so that the noise antennas are arranged in a regular cubic lattice, and wherein the test equipment comprises an array control unit configured to control the noise antennas to create the additive white Gaussian noise using at least two of the noise antennas.

* * * * *